United States Patent
Lee et al.

(10) Patent No.: US 6,781,904 B2
(45) Date of Patent: Aug. 24, 2004

(54) LOW-VOLTAGE SEMICONDUCTOR MEMORY DEVICE

(75) Inventors: Seung-Keun Lee, Gyeonggi-do (KR); Young-Ho Lim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/357,538

(22) Filed: Feb. 3, 2003

(65) Prior Publication Data

US 2003/0210581 A1 Nov. 13, 2003

(30) Foreign Application Priority Data

May 9, 2002 (KR) .................................. 10-2002-0025515

(51) Int. Cl.[7] .............................................. G11C 7/02
(52) U.S. Cl. .................................... 365/207; 365/226
(58) Field of Search ................................ 365/204, 207, 365/226, 185.24

(56) References Cited

U.S. PATENT DOCUMENTS

| 5,953,274 A | * | 9/1999 | Iwahashi | ..................... 365/204 |
| 6,018,487 A | * | 1/2000 | Lee et al. | ................... 365/204 |
| 6,157,575 A | | 12/2000 | Choi | |
| 6,347,053 B1 | | 2/2002 | Kim et al. | |

* cited by examiner

Primary Examiner—Thong Le
(74) Attorney, Agent, or Firm—Marger Johnson & McCollom, P.C.

(57) ABSTRACT

This invention provides a semiconductor memory device operating at a low operating voltage (e.g., 1.8 V) and the semiconductor memory device includes a discharge circuit for discharging a voltage of a bit line prior to read/write operations. The discharge circuit includes high-voltage and low-voltage transistors coupled in series between the bit line and a reference voltage. The high-voltage transistor is switched on and off by a high voltage and the low-voltage transistor is switched on and off by a discharge signal.

20 Claims, 4 Drawing Sheets

LOW-VOLTAGE SEMICONDUCTOR MEMORY DEVICE

CROSS REFERENCE TO RELATED APPLICATIONS

This application claims benefit of priority under 35 USC §119 to Korean Patent Application No. 2002-25515, filed on May 9, 2002, the contents of which are herein incorporated by reference in their entirety.

BACKGROUND OF THE INVENTION

1. Field of the Invention

The present invention relates to semiconductor devices, and more particularly, to a low-voltage semiconductor memory device capable of operating at a low operating voltage (e.g., about 1.8 volts).

2. Description of the Related Art

For the convenience of portability, various electronic devices have been designed to operate by means of a battery and have a small size. In cases where the battery is used instead of an AC power source, the power consumption of the electronic device must be considered, because the power consumption is closely related to the operating time of the electronic device. Among the methods for increasing the operating time of the electronic device, one method is to increase a battery capacity. In cases where the battery capacity is increased, however, the battery must also inevitably increase in size. This hinders the miniaturization of the electronic device. Another method for increasing the operating time is lowering the operating voltage (or a power supply voltage) of the electronic device. In cases where the electronic device operates using a low power supply voltage, the operating speed of the electronic device must also be considered. Thus, when a power supply voltage of an electronic device is lowered, it is important to prevent the operating speed of the electronic device from being reduced.

SUMMARY OF THE INVENTION

An object of the present invention is to provide a low-voltage semiconductor memory device capable of improving the operating speed of the device when the power supply voltage is low.

To achieve these objects and other advantages in accordance with an embodiment of the invention, there is a provided a semiconductor memory device that includes a bit line coupled to a memory cell, a sense amplifier coupled to the bit line through a first transistor, and a discharge circuit coupled to the bit line that discharges a voltage of the bit line in response to a discharge signal, where the discharge circuit includes a second and third transistor coupled in series between the bit line and a first voltage, where a gate of the second transistor is coupled to a second voltage, and where a gate of the third transistor is coupled to the discharge signal. In this embodiment, the first voltage is a ground voltage and the second voltage is a voltage higher than a power supply voltage. The first transistor and the second transistor are high-voltage transistors of which a threshold voltage is about 0.9 V and the third transistor is a low-voltage transistor of which a threshold voltage is about 0.6 V. In this embodiment of the invention, the semiconductor memory device operates at a power supply voltage of about 1.8 V.

In accordance with another embodiment of the invention, there is provided a nonvolatile semiconductor memory device comprising a memory cell array. The memory cell array includes a plurality of word lines, a plurality of bit lines, and a plurality of memory cells. The plurality of memory cells is arranged in a matrix of word lines and bit lines. The plurality of bit lines are divided into a plurality of input/output groups. A row selection circuit selects at least one of the word lines in response to a row address signal, and a column selection circuit selects at least one of the bit lines of the input/output groups in response to a column selection signal. A discharge control circuit generates discharge signals corresponding to the bit lines of the respective input/output groups in response to a transition of the row address signal and the column selection signal. A discharge circuit discharges the voltages of the bit lines in response to the discharge signals. The discharge circuit includes a plurality of bit-line discharge units corresponding to the respective input/output groups of the bit lines. Each of the bit-line discharge units includes a first and second transistor coupled in series between the corresponding bit lines and a ground voltage. A gate of the first transistor is coupled to a voltage that is higher than a power supply voltage, and a gate of the second transistor receives a corresponding discharge signal. In this embodiment, the first transistor is a high-voltage transistor where the threshold voltage is about 0.9 V and the second transistor is a low-voltage transistor where the threshold voltage is about 0.6 V. In this embodiment of the invention, the nonvolatile semiconductor memory device operates at a power supply voltage of about 1.8 V.

In accordance with yet another embodiment of the present invention, there is provided a NOR flash memory device that includes a memory cell array divided into a plurality of memory blocks, wherein each of the memory blocks includes a plurality of word lines, a plurality of local bit lines, and a plurality of memory cells. The plurality of memory cells is arranged in a matrix of word lines and local bit lines. The plurality of local bit lines is divided into a plurality of segments. The NOR flash memory device also includes a plurality of global bit lines divided into a plurality of input/output groups, where the global bit lines correspond to the segments of the bit lines in the respective memory blocks. There is also a plurality of first column selection circuits corresponding to the memory blocks, for selecting at least one of the local bit lines of the respective segments in the corresponding memory blocks, and a second column selection circuit for selecting any one of the global bit lines of the respective input/output groups and coupling the selected global bit lines to corresponding data lines. The NOR flash memory device also includes a discharge control circuit for generating discharge signals in response to a transition of the row address signal and the column selection signal, and a discharge circuit for discharging the voltages of the global bit lines in response to the discharge signals, where the discharge circuit includes a plurality of bit-line discharge units corresponding to the respective input/output groups of the global bit lines. Each of the bit-line discharge units have a first and a second transistor coupled in series between the corresponding global bit lines and a ground voltage, where the gate of the first transistor is coupled to a voltage that is higher than a power supply voltage, and where the gate of the second transistor receives a corresponding discharge signal.

BRIEF DESCRIPTION OF THE DRAWINGS

The accompanying drawings, which are included to provide a further understanding of the invention and are incorporated in and constitute a part of this application, illustrate embodiments of the invention and, together with the description, serve to explain the principle of the invention.

DETAILED DESCRIPTION OF THE INVENTION

Hereinafter, preferred embodiments of the present invention will be described in detail with reference to the accompanying drawings.

Figure 1:
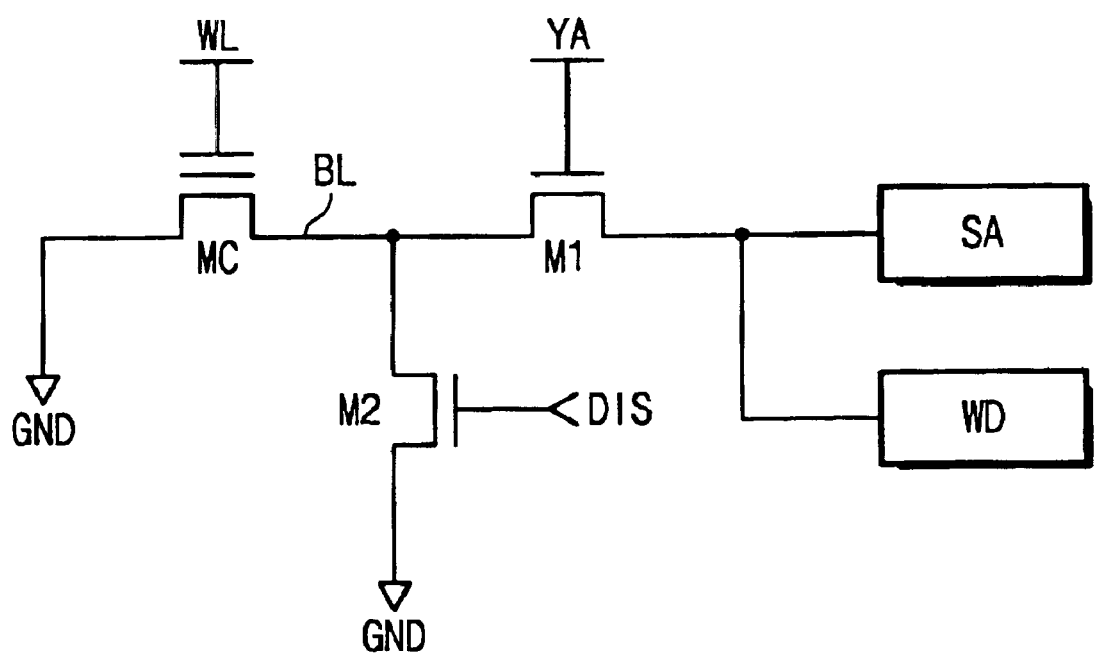
FIG. 1 is a circuit diagram of a typical nonvolatile semiconductor memory device according to a read path.

FIG. 1 is a circuit diagram of a typical nonvolatile semiconductor memory device according to a read path. The nonvolatile semiconductor memory device (e.g., a NOR flash memory device) includes a memory cell MC and the memory cell MC is implemented with a floating gate transistor. The floating gate transistor has a grounded source, a drain coupled to a bit line BL, a floating gate, and a control gate coupled to a word line WL. The bit line BL is coupled to a sense amplifier SA and a write driver WD through an NMOS transistor M1, and the NMOS transistor M1 is turned on and off in response to a signal YA. An NMOS transistor M2 acting as a discharge transistor is coupled between the bit line BL and a ground voltage GND and is turned on and off in response to a signal DIS. In the case of a NOR flash memory device, a discharge operation of the bit line BL is performed prior to read/erase/program operations.

The discharge operation is performed through the NMOS transistor M2 that is responsive to the signal DIS. Then, in the read operation, the sense amplifier SA senses a voltage change of the bit line BL, which varies according to the memory cell MC. In the program operation, the write driver WD supplies a higher voltage (e.g., 5 V to 6 V) than a power supply voltage to the bit line BL. As is well known, the memory cell MC of the NOR flash memory device is programmed by hot electron injection and erased by Fowler-Nordheim tunneling (F-N tunneling). The program and erase methods are disclosed in U.S. Pat. No. 6,347,053, entitled "NONVIOLATILE MEMORY DEVICE HAVING IMPROVED THRESHOLD VOLTAGES IN ERASING AND PROGRAMMING OPERATIONS" and in U.S. Pat. No. 6,157,575 entitled "NONVOLATILE MEMORY DEVICE AND OPERATING METHOD THEREOF", respectively, which are hereby incorporated by reference.

As described above, since the high voltage is applied to the bit line BL in the program operation, transistors disposed on data input/output paths must be implemented with "high-voltage transistors", which have thick gate oxide layers, to increase the high-voltage tolerance. In other words, the NMOS transistors M1 and M2 are implemented with high-voltage transistors.

Since the high-voltage transistor uses a much thicker gate oxide layer than a low-voltage transistor, a threshold voltage (e.g., 0.9 V) of the high-voltage transistor is higher than the threshold voltage (e.g., 0.6 V) of the low-voltage transistor. Compared with the case where the NMOS transistor M2 for discharging the voltage of the bit line BL is implemented with the low-voltage transistor, "a bit-line discharge time" is relatively longer in cases where the NMOS transistor M2 is implemented with the high-voltage transistor. The bit-line discharge time represents the time taken to discharge the bit line BL. As the power supply voltage is lowered, this phenomenon becomes much more severe. The increase of the bit-line discharge time is a factor contributing to the reduction of the operating speed. In cases where the NMOS transistor M2 is implemented with the low-voltage transistor, a breakdown of the NMOS transistor occurs when the high voltage is applied to the bit line BL. Therefore, the discharge transistor M2 must be implemented with a high-voltage transistor.

Figure 2:
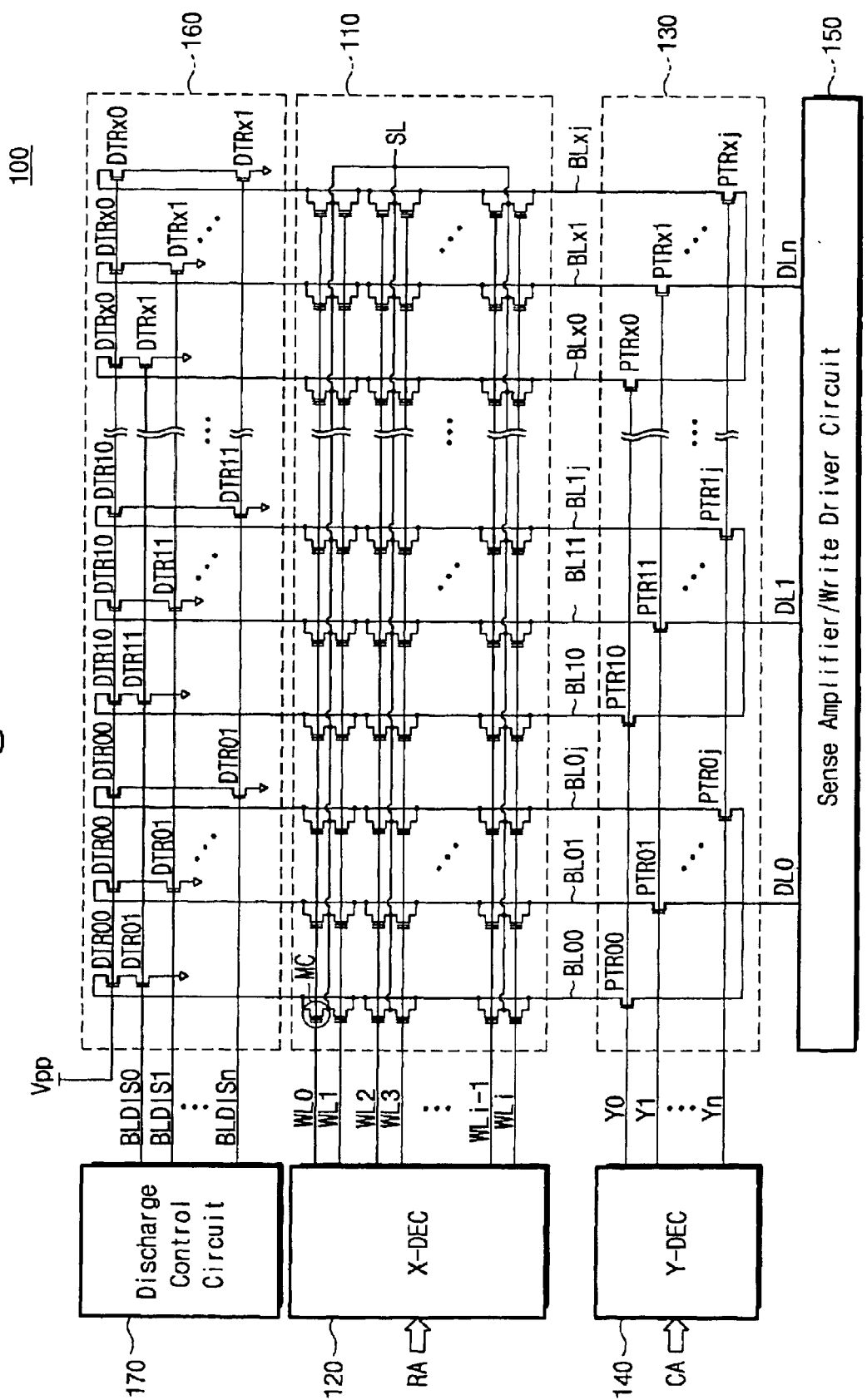
FIG. 2 is a block diagram of a nonvolatile semiconductor memory device in accordance with an embodiment of the invention.

FIG. 2 is a block diagram of a nonvolatile semiconductor memory device 100 in accordance with an embodiment of the invention. Referring to FIG. 2, the nonvolatile semiconductor memory device 100 of the present invention is a NOR flash memory device and includes a memory cell array 110. The memory cell array 110 includes a plurality of word lines WL0–WLi arranged in parallel in a row direction, a plurality of bit lines BL00–BLxj arranged in parallel in a column direction, and a plurality of memory cells MC arranged at respective intersections of the word lines and the bit lines. The bit lines arranged in the memory cell array 110 are divided into a plurality of input/output groups BL00–BL0j, BL10–BL1j, ..., BLx0–BLxj.

As shown in FIG. 2, the word lines WL0–WLi are coupled to a row decoder circuit 120 and the row decoder circuit 120 selects any one of the word lines WL0–WLi in response to row address signal RA. Although not shown in FIG. 2, the row decoder circuit 120 includes a pump circuit that receives a high voltage from a high voltage generator and transfers the high voltage to the selected word line. The bit lines are coupled to a column pass gate circuit 130. The column pass gate circuit 130 selects any one of the bit lines of the respective input/output groups in response to column selection signals Y0–Yn from the column decoder circuit 140 and then couples the selected bit lines to corresponding data lines DL0–DLm. The data lines DL0–DLm are coupled to a sense amplifier/write driver 150.

The column pass gate circuit 130 includes a plurality of column pass gate groups that respectively correspond to the data lines DL0–DLm (or the input/output groups of the bit lines). Each of the column pass gate groups includes a plurality of NMOS transistors that respectively correspond to the bit lines of the corresponding input/output groups. For example, the column pass gate group corresponding to the data line DL0 includes NMOS transistors PTR00–PTR0j. The NMOS transistors PTR00–PTR0j are coupled in parallel between the corresponding bit lines BL00–BL0j and the data line DL0 and turned on and off in response to the corresponding column selection signals Y0–Yn. In the same manner, the column pass gate group corresponding to the data line Dm includes NMOS transistors PTRx0–PTRxj. The NMOS transistors PTRx0–PTRxj are coupled in parallel between the corresponding bit lines BLx0–BLxj and the data line DLm and are turned on and off in response to the corresponding column selection signals Y0–Yn.

The NOR flash memory device 100 of the embodiment in FIG. 2 further includes a discharge circuit 160 and a discharge control circuit 170. The discharge circuit 160 is coupled to the bit lines of the input/output groups and the discharge control circuit 170 discharges the voltages of the bit lines in response to discharge signals BLDIS0–BLDISn. The discharge circuit 160 is divided into discharge units that respectively correspond to the input/output groups of the bit lines, and each of the discharge units includes a plurality of NMOS transistors. For example, the discharge unit corresponding to a first input/output group includes two NMOS transistors DTR00 and DTR01 coupled in series between the respective bit lines BL00–BL0j of the first input/output group and the ground voltage. The discharge unit corresponding to the second input/output group includes two NMOS transistors DTR10 and DTR11 coupled in series between the respective bit lines BL10–BL1j of the second input/output group and the ground voltage. In this manner, the discharge unit corresponding to the final input/output group includes two NMOS transistors DTRx0 and DTRx1 coupled in series between the respective bit lines BLx0–BLxj of the final input/output group and the ground voltage.

In this embodiment, the NMOS transistors coupled in series between the respective bit lines and the ground voltage include high-voltage transistors and low-voltage transistors. For example, the NMOS transistor whose drain is coupled to the bit line is the high-voltage transistor and the NMOS transistor whose source is coupled to the ground voltage is the low-voltage transistor. Gates of the high-voltage NMOS transistors DTR00, DTR10, . . . , DTRx0 are coupled to a high voltage Vpp. The low-voltage NMOS transistors DTR01, DTR11, . . . , DTRx1 of the respective discharge units are turned on and off in response to the corresponding discharge signals BLDIS0–BLDISn, respectively. Although it is not shown in FIG. 2, the high voltage Vpp is generated by a pump circuit.

The discharge control circuit 170 outputs the discharge signals BLDIS0–BLDISn in response to a transition of the row address signal and the column selection signal. In this embodiment of the invention, all of the discharge signals BLDIS0–BLDISn have a high level during a bit-line discharge period. Then, among the discharge signals BLDIS0–BLDISn, one discharge signal corresponding to the selected bit line is placed at a low level and the remaining discharge signals are continuously maintained at the high level. This means that the unselected bit lines of each input/output group are coupled to the ground voltage through the corresponding high-voltage and low-voltage transistors.

Figure 3:
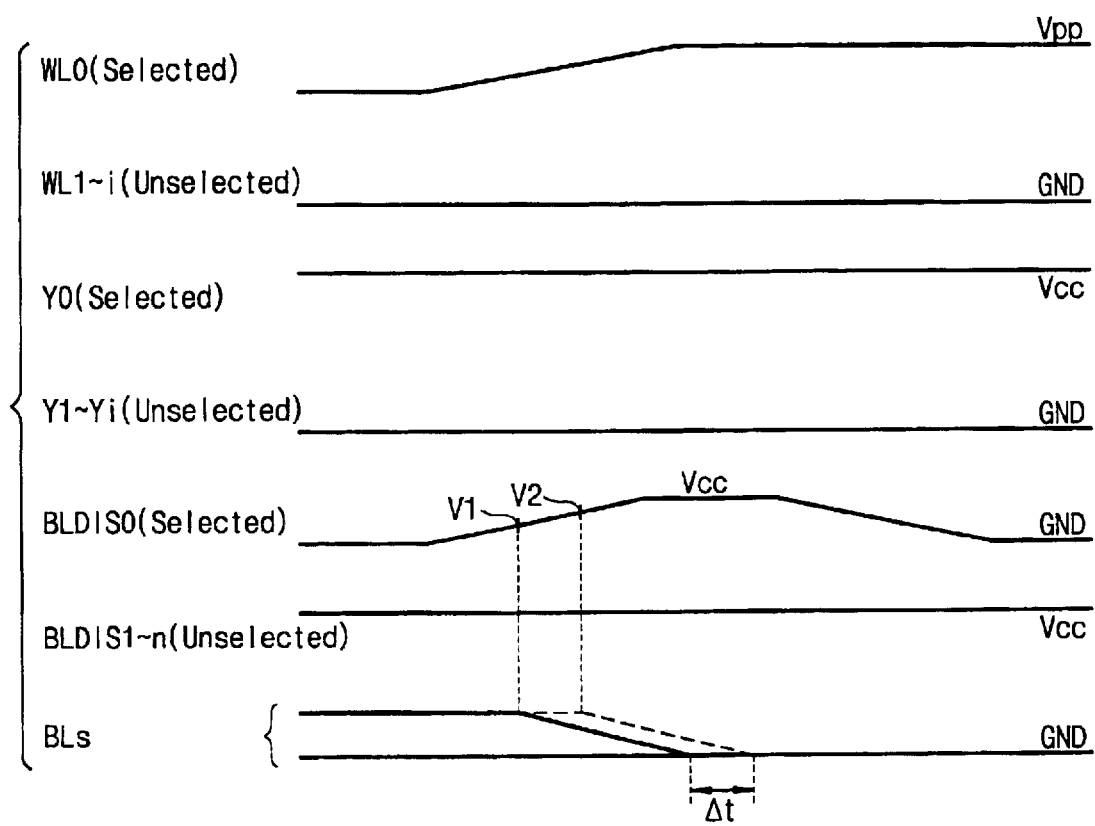
FIG. 3 is a timing chart showing a discharge operation of the bit lines in the nonvolatile semiconductor memory device illustrated in FIG. 2.

FIG. 3 is a timing chart explaining the discharge operation of the bit line in the nonvolatile semiconductor memory device illustrated in FIG. 2. As described above, prior to the read and write operations, the voltages of bit lines selected during previous read/write operations must be discharged. To perform the next read/write operation after completing the previous read/write operation, a transition of the row address signal occurs and an address transition detecting circuit (not shown) detects the transition of the row address signal. The discharge control circuit 170 outputs the discharge signals BLDIS0–BLDISn in response to a transition of the row address signal and the column selection signals.

For purposes of illustration, it is assumed that the first bit line of each input/output group is successively selected during the previous and present read operations. According to this assumption, the voltage of the selected bit line must be discharged prior to the read operation. In order to do this, the discharge control circuit 170 activates the discharge signal BLDIS0, which corresponds to the selected bit line, to a high level in response to a transition of the row address signal and the column selection signal. As the discharge signal BLDIS0 reaches the high level, the voltage of the bit line (e.g., BL00) selected during the previous read/write operation is discharged through the NMOS transistors DTR00 and DTR01 of the discharge circuit 160. After discharging all the voltages of the selected bit lines, the activated discharge signal BLDIS0 is inactivated to a low level. During this time, as shown in FIG. 3, the remaining discharge signals BLDIS1–BLDISn are continuously maintained at the high level. Next, the read/write operations are substantially performed according to the well-known method.

In the case of the embodiment illustrated in FIG. 2, the high-voltage and low-voltage transistors are coupled in series between the bit line and the ground voltage so as to discharge the voltage of the bit line. Here, since the gates of the high-voltage transistors are fixedly coupled to the high voltage Vpp, the high-voltage transistors are always turned on. For these reasons, as shown in FIG. 3, when the discharge signal corresponding to the selected bit line is activated, the bit-line discharge time of the memory device is shortened as much as $\Delta t$ compared with that of the typical semiconductor memory device shown in FIG. 1. This is explained in greater detail in the following paragraph.

Since the discharge transistor M1 shown in FIG. 1 is the high-voltage transistor, the voltage of the bit line is not discharged until the signals DIS reaches a voltage of V2. In other words, the discharge transistor M1 is not turned on. To the contrary, in the embodiment illustrated by FIG. 2, since the high-voltage transistors are always turned on, the voltage of the bit line starts to be discharged when the discharge signal BLDIS0 reaches a voltage of V1 (a threshold voltage of the low-voltage transistor). Therefore, as seen in FIG. 3, the bit-line discharge time can be shortened as much as $\Delta t$. The shortening of the bit-line discharge time results in an improvement to the operating speed.

Figure 4:
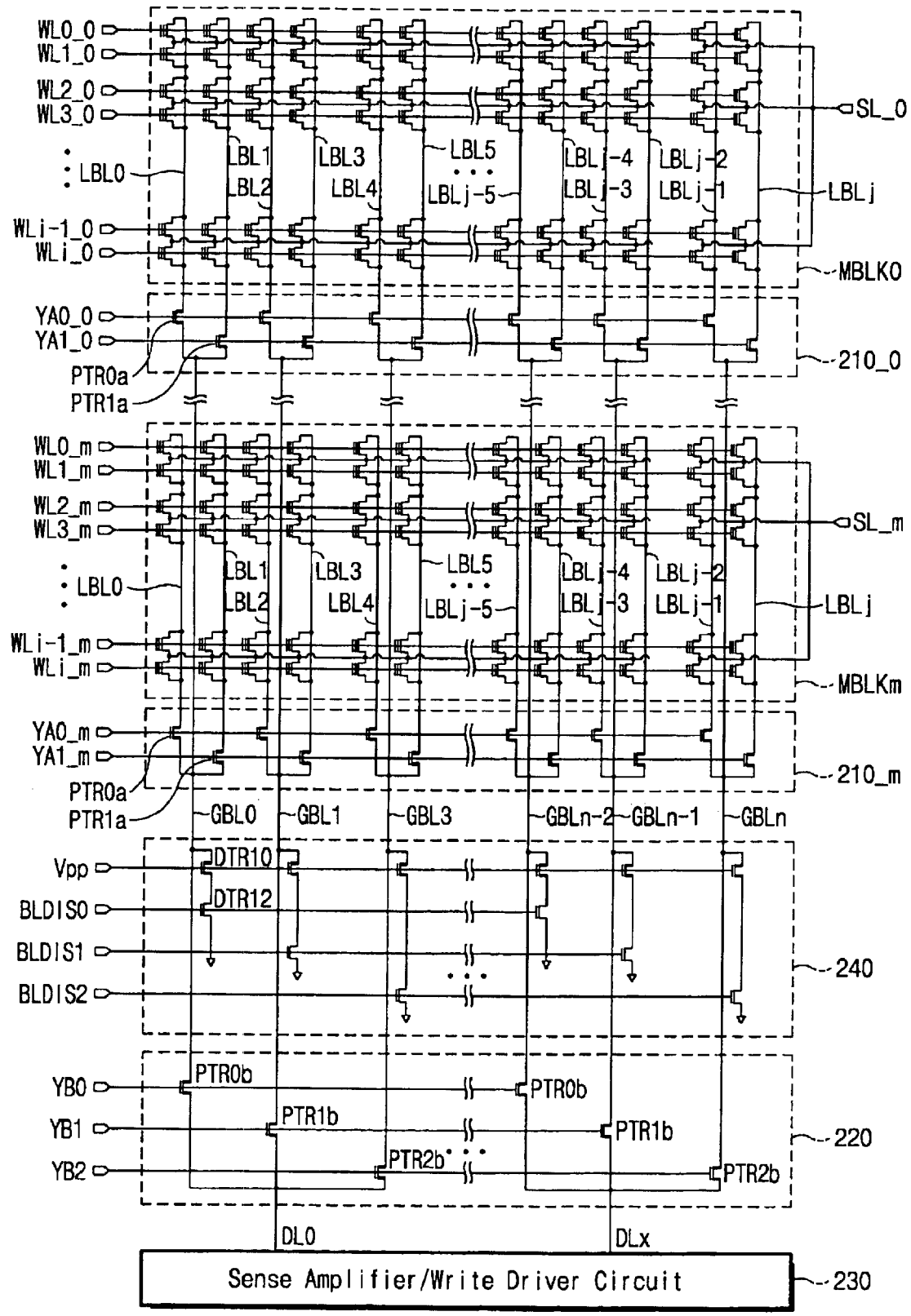
FIG. 4 is a block diagram of a nonvolatile semiconductor memory device in accordance with another embodiment of the present invention.

FIG. 4 is a block diagram of a nonvolatile semiconductor memory device in accordance with another embodiment of the present invention.

Referring to FIG. 4, a nonvolatile semiconductor memory device includes a memory cell array and the memory cell array is configured with a plurality of memory blocks MBLK0–MBLKm. Each of the memory blocks MBLK0–MBLKm includes a plurality of word lines WL0_k–WLi_k arranged in parallel with a row direction, a plurality of local bit lines LBL0–LBLj arranged in parallel with a column direction, and a plurality of memory cells MC arranged at respective intersections of the word lines and the local bit lines. The local bit lines LBL0–LBLj of the memory blocks MBLK0–MBLKm are coupled to a corresponding first column selection circuit 210_0–210_m. The first column selection circuits 210_0–210_m are configured with a plurality of NMOS transistors PTR0a–PTR1a. In addition, the first column selection circuits 210_0–210_m select odd or even local bit lines among the local bit lines LBL0–LBLj of the corresponding memory blocks MBLK0–MBLKm and then couple the selected local bit lines to a corresponding global bit line GBL0–GBLn. For example, the first column selection circuit 210_0 selects the odd or even local bit lines among the local bit lines LBL0–LBLj in response to corresponding column selection signals YA0_0–YA1_0 and then couples the selected local bit lines to the corresponding global bit lines GBL0–GBLn.

The global bit lines GBL0–GBLn are coupled to a second column selection circuit 220. The second column selection circuit 220 includes a plurality of NMOS transistors PTR0b, PTR1b and PTR2b and selects some of the global bit lines GBL0–GBLn in response to the column selection signals YB0–YB2. The selected global bit lines are coupled to a sense amplifier/write driver 230 through corresponding data lines DL0–DLx. The global bit lines GBL0–GBLn are also coupled to a discharge circuit 240 and the discharge circuit 240 discharges the voltages of the global bit lines (along with the voltages of the attached local bit lines as well). The discharge circuit 240 includes NMOS transistors DTR10 and DTR12 coupled in series between the respective global bit lines and the ground voltage. Among the two NMOS transistors DTR10 and DTR12 corresponding to the respective global bit lines, one DTR10 is the high-voltage transistor and the other DTR12 is the low-voltage transistor. The gates of the high-voltage transistors DTR10 are commonly coupled to the high voltage Vpp. The gates of the low-voltage transistors DTR12 are coupled to the corresponding discharge signals BLDIS0, BLDIS1 and BLDIS2, respectively.

Since a discharge operation of the semiconductor memory device shown in FIG. 4 is similar to that of FIG. 2, a detailed description will be omitted. It is obvious that the semiconductor memory device shown in FIG. 4 can obtain the same effect described with respect to the embodiment illustrated in FIG. 2. In other words, as described above, since the high-voltage transistors are always turned on, the voltages of the local and global bit lines start to discharge when a predetermined discharge signal reaches a voltage of V1 (a threshold voltage of the low-voltage transistor). Therefore, the bit-line discharge time is shortened by the use of the discharge circuit 240.

As described above, the voltages of the bit lines are discharged using the high-voltage and low-voltage transistors coupled in series between the bit lines and the ground voltage, so that the bit-line discharge time is shortened when the power supply voltage is low. Consequently, the operating speed is improved in proportion to the shortening of the bit-line discharge time.

It will be apparent to those skilled in the art that various modifications can be made to obtain variations of the embodiments that have been presented. Thus, it is intended that the invention cover all modifications and variations of these embodiments provided that they are within the scope of the appended claims and their equivalents.

What is claimed is:

1. A device comprising:
a bit line coupled to a memory cell;
a sense amplifier coupled to the bit line through a first transistor; and
a discharge circuit coupled to the bit line that discharges a voltage of the bit line in response to a discharge signal, wherein the discharge circuit includes a second and a third transistor coupled in series between the bit line and a first voltage, wherein a gate of the second transistor is coupled to a second voltage, and wherein a gate of the third transistor is coupled to the discharge signal.

2. The device of claim 1, wherein the first voltage is a ground voltage and the second voltage is a voltage higher than a power supply voltage.

3. The device of claim 1, wherein the first transistor and the second transistor are high-voltage transistors with a threshold voltage of about 0.9 V and the third transistor is a low-voltage transistor with a threshold voltage of about 0.6 V.

4. The device of claim 1, wherein the device operates at a power supply voltage of about 1.8 V.

5. A device comprising:
a memory cell array, wherein the memory cell array comprises a plurality of word lines, a plurality of bit lines and a plurality of memory cells, wherein the plurality of memory cells are arranged according to a matrix formed by the plurality of word lines and the plurality of bit lines, and wherein the plurality of bit lines are divided into a plurality of input/output groups;

a row selection circuit for selecting at least one of the word lines in response to a row address signal;
a column selection circuit that selects at least one of the bit lines from every one of the plurality of input/output groups in response to a column address signal;
an amplification circuit that detects a voltage change on the at least one of the bit lines selected by the column selection circuit;
a discharge control circuit that generates discharge signals corresponding to the plurality of bit lines in response to a transition of the row address signal and the column address signal; and
a discharge circuit that selectively discharges the voltages of the plurality of bit lines in response to the discharge signals, the discharge circuit further comprising a plurality of bit-line discharge units each corresponding to a respective one of the plurality of input/output groups, each of the bit-line discharge units having a first transistor and a second transistor coupled in series between a corresponding one of the plurality of bit lines and a ground voltage, a gate of the first transistor being coupled to a voltage higher than a power supply voltage, and a gate of the second transistor receiving a corresponding one of the discharge signals.

6. The device of claim 5, wherein the first transistor is a high-voltage transistor with a threshold voltage of about 0.9 V and the second transistor is a low-voltage transistor with a threshold voltage of about 0.6 V.

7. The device of claim 5, wherein the device operates with a power supply voltage of about 1.8 V.

8. The device of claim 5, wherein the device includes a NOR flash memory device.

9. The device of claim 5, wherein the first transistor and the second transistor are NMOS transistors.

10. A device comprising:
a memory cell array divided into a plurality of memory blocks, wherein each of the memory blocks comprises a plurality of word lines, a plurality of local bit lines and a plurality of memory cells, wherein the plurality of memory cells are arranged according to a matrix formed by the plurality of word lines and the plurality of local bit lines, wherein the plurality of local bit lines are grouped into a plurality of segments;
a plurality of global bit lines each corresponding to one of the plurality of segments, wherein the plurality of global bit lines is grouped into a plurality of input/output groups;
a plurality of first column selection circuits each corresponding to one of the plurality of memory blocks that selects at least one of the plurality of local bit lines from the plurality of segments;
a second column selection circuit that selects any one of the plurality of global bit lines from the plurality of input/output groups and couples the selected any one of the plurality of global bit lines to a data line, wherein the data line corresponds to the input/output group containing the selected any one of the plurality of global bit lines;
a discharge control circuit that generates discharge signals in response to a transition of a row address signal and a transition of a column selection signal; and
a discharge circuit that selectively discharges the voltages of the plurality of global bit lines in response to the discharge signals, the discharge circuit further comprising a plurality of bit-line discharge units each corresponding to one of the plurality of input/output groups, wherein each of the bit-line discharge units has a first transistor and a second transistor coupled in series between a corresponding one of the plurality of global bit lines and a ground voltage, wherein a gate of the first transistor is coupled to a voltage higher than a power supply voltage, and wherein a gate of the second transistor receiving a corresponding one of the discharge signals.

11. The device of claim 10, wherein the first transistor is a high-voltage transistor with a threshold voltage of about 0.9 V and the second transistor is a low-voltage transistor with a threshold voltage of about 0.6 V.

12. The device of claim 10, wherein the device operates at a power supply voltage of about 1.8 V.

13. The device of claim 10, wherein the nonvolatile device comprises a NOR flash memory device.

14. The device of claim 10, wherein the first transistor and the second transistor are NMOS transistors.

15. A device comprising:
   a bit line coupled to a memory cell;
   a sense amplifier coupled to the bit line through a first high-voltage transistor with a threshold voltage of about 0.9V; and
   a discharge circuit coupled to the bit line that discharges a voltage of the bit line in response to a discharge signal, wherein the discharge circuit includes a second high-voltage transistor with a threshold voltage of about 0.9V and a low-voltage transistor with a threshold voltage of about 0.6V coupled in series between the bit line and a first voltage, wherein a gate of the second high-voltage transistor is coupled to a second voltage, and wherein a gate of the low-voltage transistor is coupled to the discharge signal.

16. The device of claim 15, wherein the device operates at a power supply voltage of about 1.8 V.

17. A device comprising:
   a memory cell array, wherein the memory cell array comprises a plurality of word lines, a plurality of bit lines and a plurality of memory cells, wherein the plurality of memory cells are arranged according to a matrix formed by the plurality of word lines and the plurality of bit lines, and wherein the plurality of bit lines are divided into a plurality of input/output groups;
   a row selection circuit for selecting at least one of the word lines in response to a row address signal;
   a column selection circuit that selects at least one of the bit lines from every one of the plurality of input/output groups in response to a column address signal;
   an amplification circuit that detects a voltage change on the at least one of the bit lines selected by the column selection circuit;
   a discharge control circuit that generates discharge signals corresponding to the plurality of bit lines in response to a transition of the row address signal and the column address signal; and
   a discharge circuit that selectively discharges the voltages of the plurality of bit lines in response to the discharge signals, the discharge circuit further comprising a plurality of bit-line discharge units each corresponding to a respective one of the plurality of input/output groups, each of the bit-line discharge units having a high-voltage transistor with a threshold voltage of about 0.9V and a low-voltage transistor with a threshold voltage of about 0.6V coupled in series between a corresponding one of the plurality of bit lines and a ground voltage, a gate of the first transistor being coupled to a voltage higher than a power supply voltage, and a gate of the second transistor receiving a corresponding one of the discharge signals.

18. The device of claim 17, the power supply voltage at about 1.8 V.

19. A device comprising:
   a memory cell array divided into a plurality of memory blocks, wherein each of the memory blocks comprises a plurality of word lines, a plurality of local bit lines and a plurality of memory cells, wherein the plurality of memory cells are arranged according to a matrix formed by the plurality of word lines and the plurality of local bit lines, wherein the plurality of local bit lines are grouped into a plurality of segments;
   a plurality of global bit lines each corresponding to one of the plurality of segments, wherein the plurality of global bit lines is grouped into a plurality of input/output groups;
   a plurality of first column selection circuits each corresponding to one of the plurality of memory blocks that selects at least one of the plurality of local bit lines from the plurality of segments;
   a second column selection circuit that selects any one of the plurality of global bit lines from the plurality of input/output groups and couples the selected any one of the plurality of global bit lines to a data line, wherein the data line corresponds to the input/output group containing the selected any one of the plurality of global bit lines;
   a discharge control circuit that generates discharge signals in response to a transition of a row address signal and a transition of a column selection signal; and
   a discharge circuit that selectively discharges the voltages of the plurality of global bit lines in response to the discharge signals, the discharge circuit further comprising a plurality of bit-line discharge units each corresponding to one of the plurality of input/output groups, wherein each of the bit-line discharge units has a high-voltage transistor with a threshold voltage of about 0.9V and a low-voltage transistor with a threshold voltage of about 0.6V coupled in series between a corresponding one of the plurality of global bit lines and a ground voltage, wherein a gate of the high-voltage transistor is coupled to a voltage higher than a power supply voltage, and wherein a gate of the low-voltage transistor receives a corresponding one of the discharge signals.

20. The device of claim 19, the power supply voltage at about 1.8 V.

* * * * *